(12) United States Patent
Pineda De Gyvez et al.

(10) Patent No.: US 7,332,953 B2
(45) Date of Patent: Feb. 19, 2008

(54) CIRCUIT AND METHOD FOR CONTROLLING THE THRESHOLD VOLTAGE OF TRANSISTORS

(75) Inventors: Jose De Jesus Pineda De Gyvez, Eindhoven (NL); Massimo Leone, Catania (IT)

(73) Assignee: NXP B.V., Eindhoven (NL)

( * ) Notice: Subject to any disclaimer, the term of this patent is extended or adjusted under 35 U.S.C. 154(b) by 47 days.

(21) Appl. No.: 10/523,666

(22) PCT Filed: Aug. 4, 2003

(86) PCT No.: PCT/IB03/03473

§ 371 (c)(1),
(2), (4) Date: Feb. 4, 2005

(87) PCT Pub. No.: WO2004/015867

PCT Pub. Date: Feb. 19, 2004

(65) Prior Publication Data

US 2006/0038605 A1   Feb. 23, 2006

(30) Foreign Application Priority Data

Aug. 8, 2002  (EP) ................................. 02078286
Sep. 13, 2002 (EP) ................................. 02078778

(51) Int. Cl.
*H03K 3/01* (2006.01)

(52) U.S. Cl. ....................................................... 327/534
(58) Field of Classification Search ................ 327/534, 327/535
See application file for complete search history.

(56) References Cited

U.S. PATENT DOCUMENTS

| 5,070,306 | A  | * | 12/1991 | Okamoto ..................... 330/253 |
| 5,087,830 | A  | * | 2/1992  | Cave et al. ................... 327/539 |
| 5,223,753 | A  | * | 6/1993  | Lee et al. ....................... 327/65 |
| 5,397,934 | A  |   | 3/1995  | Farrenkopf .................. 327/537 |
| 5,811,993 | A  | * | 9/1998  | Dennard et al. .............. 327/54 |
| 6,002,245 | A  | * | 12/1999 | Sauer .......................... 323/315 |
| 6,486,727 | B1 | * | 11/2002 | Kwong ........................ 327/534 |
| 6,529,421 | B1 | * | 3/2003  | Marr et al. ............. 365/189.09 |

* cited by examiner

*Primary Examiner*—Quan Tra
(74) *Attorney, Agent, or Firm*—Peter Zawilski

(57) ABSTRACT

A control unit, for controlling a threshold voltage of a circuit unit having transistor devices, includes a reference circuit and a measuring unit. The measuring unit is configured to measure a threshold voltage of at least one sensing transistor of the circuit unit, and to measure a threshold voltage of at least one reference transistor of the reference circuit. A differential voltage generator is configured to generate a differential voltage from outputs of the measuring unit and a bulk connection of the transistor devices in the circuit unit to which the differential voltage is fed as a biasing voltage.

22 Claims, 8 Drawing Sheets

CIRCUIT AND METHOD FOR CONTROLLING THE THRESHOLD VOLTAGE OF TRANSISTORS

The invention relates to a control unit controlling a threshold voltage of a circuit unit having a plurality of transistor devices.

Threshold voltage variability can have a deleterious impact on circuit performance. Namely, it has an adverse impact on power consumption and cell delay. With technology scaling into the deep-submicron domain, statistical variations of threshold voltage within a chip are more obvious. Equally important are the variations that arise due to the scaling of the power supply and corresponding voltage bounce.

Threshold voltage control and bulk biasing is, in principle, known from M. Miyazaki et. al., "A Delay Distribution Squeezing Scheme with Speed-Adaptive Threshold-Voltage CMOS (SA-Vt CMOS) for Low Voltage LSIs," mt. Symp on Low Power Electronics and Design, pp. 48-53, 1998 and Kuroda et. al., "A O.9V 150 MHz 10 mW 4 mm 2-D Discrete Cosine Transform Core Processor with Variable Threshold-Voltage Scheme," 1996 ISSCC Digest of Technical Papers, pp. 166-167. Threshold voltage control has been used for leakage current and delay improvement. Similarly, threshold voltage extraction has been reported, see J J Liou et. al., "Extraction of Threshold Voltage of Mosfets: An Overview," IEEE Hong Kong Electron Devices Meeting, pp. 31-38, 1997. The purpose of these circuits is to extract an absolute threshold voltage value.

U.S. 2002/0005750 A1 discloses an adaptive body bias circuit forward or reverse biases bodies of transistors within a compensated circuit as a result of measured parameters of an integrated circuit. The adaptive body bias circuit includes a matched circuit that includes a replica of a signal path within the compensated circuit. The phase of a clock signal at the input to the matched circuit is compared to a phase of a delayed clock signal at the output of the matched circuit. When the delay through the matched circuit varies about one period of the clock signal, a non-zero error value is produced. A bias voltage is generated as a function of the error value, and the bias voltage is applied to the compensated circuit as well as the matched circuit. Integrated circuits can include many adaptive body bias circuits. Bias values can be stored in memories for later use, and bias values within memories can be updated periodically to compensate the circuit over time.

U.S. Pat. No. 6,275,094 B1 discloses a CMOS device fabricated in a silicon-on-insulator structure and including circuitry and methods in a first embodiment dynamically shifts the threshold voltage of the CMOS device in a receiver to provide improved noise margin and in a second embodiment dynamically matches the threshold voltages in a differential amplifier to correct for manufacturing offset. To dynamically shift the threshold voltage for noise immunity, the back gate or bulk nodes of the devices is shifted through two similar circuits comprised of npn inverters with clamping devices. The back gate of the n device is biased at 0 volts for the maximum Vth and is biased at +1 threshold for the minimum Vth of the device. Only the back gate of the p device is biased at Vdd for the maximum Vth of the device and is biased at 1 Vth below Vdd for the minimum Vth of the device. The Vth of the n device and the p device should be less than the forward bias of the respective source volt junctions to prevent unwanted bipolar currents. By driving the back gates in opposite direction and in phase with the input to the receiver circuit, the threshold voltage of the receiver is moved away from ground (GND) when the input is at a logical "0" and way from Vdd when the input is at a logical "1" which raises the noise immunity of the receiver and speeds the response of the receiver to a desired signal To dynamically match a differential pair for offset correction, a feedback circuit performs a fast Fourier transformer analysis of the output signal to determine the presence of even harmonics. A feedback voltage is generated representative of the even harmonics and applied to the back bias contacts of the CMOS devices to correct the effects of the threshold mismatch in the differential pair.

U.S. 2002/0005750 A1 refers to a plurality of blocks, uses matched circuits that include a replica to compensate delays, and uses a feedback scheme for compensation.

U.S. Pat. No. 6,275,094 B1 primarily enhances the noise immunity of a receiver digital circuit and the mismatch of the differential pair of an amplifier. For the amplifier the harmonic distortions are minimized through a micro in the feedback that computes a Fourier transform.

It is an object of the present invention to provide a control unit controlling a threshold voltage of a circuit unit, an integrated circuit (IC) device comprising a circuit unit and a control unit controlling a threshold voltage of a circuit unit and a method for controlling a threshold voltage of a circuit unit which are able to cope with differences in the threshold voltages of a plurality of transistors of a circuit unit whose differences are caused for example by fabrication mismatch, temperature gradients, circuit noise, etc.

To achieve the object of the present invention a control unit is provided controlling a threshold voltage of a circuit unit having a plurality of transistor devices, comprising a reference circuit, a measuring unit measuring a threshold voltage of at least one sensing transistor of the circuit unit and measuring a reference threshold voltage of at least one reference transistor of the reference circuit, a differential voltage generator generating a differential voltage from outputs of the measuring unit and a bulk connection of the transistor devices in the circuit unit to which the differential voltage is fed as a biasing voltage. The present invention enables to control the fabrication mismatch by e.g. noise, $V_t$ mismatch. This is useful for every IC production particularly for deep sub-micron IC's which are sensitive to such fabrication mismatches. Therefore, the production costs are decreased and what is most important for semiconductor industry the number of IC's with malfunction is decreased. A further advantageous feature is the use of the differential voltage and not the absolute voltage for controlling a threshold voltage of a circuit unit, because the differential voltage can be directly used to eliminate the difference between the threshold voltage of the circuit unit and the at least one reference transistor.

According to a preferred embodiment of the present invention, the differential voltage generator comprises an averaging unit forming at least one average threshold voltage value of at least one measured transistor threshold voltage of the circuit unit, a comparing unit comparing at least one average threshold voltage value of the circuit unit with at least one measured transistor threshold voltage of the reference circuit and creating at least one difference voltage value indicating the difference between at least one average threshold voltage value of the circuit unit and at least one transistor threshold voltage of the reference circuit, an amplifier unit amplifying at least one difference voltage value of the comparing unit and creating at least one amplified difference voltage value. The advantage of this embodiment is that the differential voltage generator creates an average threshold voltage of the entire circuit unit, which gives a very reliable threshold of the true threshold voltage. This average threshold voltage is set in relation to the threshold voltage of the reference circuit. This enables to determine the difference between the average threshold voltage and the one of the reference circuit to create a voltage which turns the difference to zero.

According to a further preferred embodiment of the present invention, the amplifier unit is a high gain amplifier.

According to a further preferred embodiment of the present invention, the reference circuit comprises at least one reference transistor in at least one comparator amplifier. The advantage of at least one reference transistor is that different reference voltages are used or that a very reliable reference voltage is created by at least one reference transistor creating a reliable reference voltage.

According to a further preferred embodiment of the present invention, the reference transistor is placed on a chip comprising the circuit unit. The reference transistor is on the same wafer or on the same chip, respectively, which leads to a small circuit area for the circuit unit and the reference transistor.

According to a further preferred embodiment of the present invention, the reference transistor is provided in a separate well of the chip comprising the circuit unit. The reference transistor is completely independent from the circuit unit when it is manufactured in a separate well. This leads to a reliable reference voltage of the reference transistor.

According to a further preferred embodiment of the present invention, the reference transistor is controlled separately from the transistor devices of the circuit unit by a reference voltage.

According to a further preferred embodiment of the present invention, the measuring unit comprises at least one sensing transistor sensing the threshold voltage. The possibility to use several sensing transistors has the advantage that at least one threshold voltage is used for determining the average threshold voltage.

According to a further preferred embodiment of the present invention, the sensing transistor is placed on a chip comprising the circuit unit so that the sensing transistor undergoes the same temperature and other physical influences as the transistors of the circuit unit which improves accuracy of the evaluated reference voltage.

According to a further preferred embodiment of the present invention, the sensing transistor is controlled separately from the reference transistor by a sensing voltage which gives more flexibility in the evaluation of the reference voltage.

According to a further preferred embodiment of the present invention, the reference voltage and/or the sensing voltage are DC or AC voltages. The possibility to use either a DC or a AC voltage has the advantage that there is no limitation in regard to the kind of the voltages.

According to a further preferred embodiment of the present invention, the circuit unit comprises a plurality of transistor devices, and wherein a first sub-plurality of the transistor devices is employed as reference transistors and a second sub-plurality of the transistor devices is employed as sensing transistors, and wherein the differential output of the differential voltage generator is fed, as a biasing voltage to the bulk of the plurality of transistor devices. This preferred embodiment has the advantage that no separate reference circuit has to be used. As a reference circuit is also at least one transistor of the circuit unit possible.

To achieve the object of the present invention, an integrated circuit (IC) device comprises a circuit unit and a control unit according to any of the preceding claims. The advantage of this embodiment is that all essential parts of the present invention are included on one integrated circuit.

To achieve the object of the present invention a method is provided for controlling of at least one threshold voltage of transistors in a circuit unit comprising measuring at least one transistor threshold voltage of the circuit unit, providing at least one reference transistor and measuring a threshold voltage of the at least one reference transistor, generating a differential voltage from outputs of the measuring unit and feeding the differential voltage as a biasing voltage to a bulk connection of the transistor devices in the circuit unit.

According to a preferred embodiment of the present invention, the generating step comprises forming at least one average threshold voltage value of at least one measured transistor threshold voltage of the circuit unit, comparing at least one average threshold voltage value of the circuit unit with at least one measured transistor threshold voltage of the reference circuit and creating at least one difference voltage representing the difference between at least one average threshold voltage value of the circuit unit and at least one transistor threshold voltage of at least one reference transistor; and amplifying the at least one difference voltage of the comparing unit and creating at least one amplified difference voltage.

According to a further preferred embodiment of the present invention, the difference voltage value is amplified by a high gain amplifier.

According to a further preferred embodiment of the present invention, at least one reference transistor in at least one comparator amplifier is used as reference circuit.

According to a further preferred embodiment of the present invention, the reference transistor is placed on a chip comprising the circuit unit.

According to a further preferred embodiment of the present invention, the reference transistor is provided in a separate well of the chip comprising the circuit unit.

According to a further preferred embodiment of the present invention, the reference transistor is controlled separately from the transistor devices of the circuit unit by a reference voltage.

According to a further preferred embodiment of the present invention, the threshold voltage is sensed by at least one sensing transistor.

According to a further preferred embodiment of the present invention, the sensing transistor is placed on a chip comprising the circuit unit.

According to a further preferred embodiment of the present invention, the sensing transistor is controlled separately from the reference transistor by a sensing voltage.

According to a further preferred embodiment of the present invention, the method employs DC or AC voltages for the reference voltage and/or the sensing voltage.

According to a further preferred embodiment of the present invention, a plurality of transistor devices is divided up into a first sub-plurality of reference transistors and a second sub-plurality of sensing transistors and wherein the transistor threshold voltage of the first sub-plurality is measured as reference voltage, the threshold voltage of the second sub-plurality is measured as sensing voltage, a differential voltage is generated from the reference voltage and the sensing voltage and wherein the differential voltage is input to the bulk of the plurality of transistor devices.

According to a further preferred embodiment of the present invention, the controlling of at least one threshold voltage of transistors in a circuit unit is done in a closed loop. The advantage of this preferred embodiment is that the controlling in a closed loop adjusts the threshold voltage in a continuous way by continuous eliminating the difference between the threshold voltage of the circuit unit and the reference circuit.

According to a further preferred embodiment of the present invention, the controlling in the closed loop includes a controlling of a power supply.

According to a further preferred embodiment of the present invention, the amplified average voltage is negatively fed back to the circuit unit for reducing the threshold voltage difference between the circuit unit and the reference circuit.

According to a further preferred embodiment of the present invention, the threshold voltage is directly measured. Unlike other approaches used to control the $V_t$ through indirect monitoring, such as line delay and leakage current, our approach monitors directly the value of Vt. This has the advantage that possible problems in obtaining the measured value are eliminated by the direct measurement.

These and various other advantages and features of novelty which characterize the present invention are pointed out with particularity in the claims annexed hereto and forming a part hereof. However, for a better understanding of the present invention, its advantages, and the object obtained by its use, reference should be made to the drawings which form a further part hereof, and to the accompanying descriptive matter in which there are illustrated and described preferred embodiments of the present invention.

Figure 1:
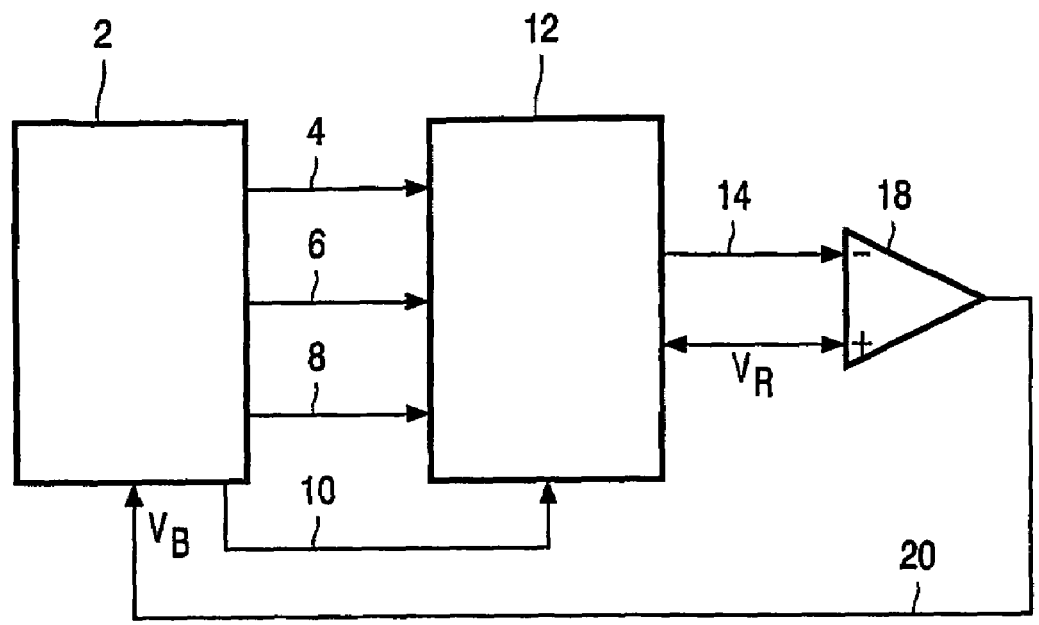
FIG. 1 shows the structure of the control unit controlling a threshold voltage of a circuit unit according to the present invention.

FIG. 1 shows the principle structure of the control unit controlling a threshold voltage of a circuit unit. The module comprises a circuit unit 2 for providing different threshold voltages $V_{t1}$ through line 4, $V_{t2}$ through line 6, and $V_{tn}$, through line 8, and a reference voltage $V_{trf}$ through line 10 to the $\Delta V_t$ monitor 12. The monitor 12 creates the average threshold voltage value of the circuit unit 2. The monitor 12 outputs a dc reference $V_R$ and the averaged threshold voltage difference $\Delta V_t$ through line 14 and receives the reference voltage $V_R$ through line 10. The reference voltage $V_R$ is also supplied to the plus terminal of an amplifier 18. The amplifier 18 receives the average threshold voltage difference $\Delta V_t + V_R$ on its plus terminal and the reference voltage $V_R$ on its minus terminal. The amplifier 18 outputs the biasing voltage $V_R$ through line 20 to the circuit unit 2.

As FIG. 1 shows, the present invention comprises a closed loop scheme, and corresponding circuitry, to control the threshold voltages $V_{t1}$ to $V_{tn}$ of the transistors in the circuit unit 2. The control is done via adaptive bulk biasing and differential measurement of the threshold voltages $V_{t1}$ to $V_{tn}$ against the reference voltage $V_{trf}$. Through the use of a simple $V_t$ mismatch monitor 12, a multi-point threshold voltage sensing scheme is used to obtain an average value of the threshold voltage throughout the entire circuit unit 2. The loop controls the mismatch in the threshold voltages $V_{t1}$ to $V_{tn}$ that arises due to the randomness of the fabrication process, due to online temperature gradients and also due to the mismatch that arises from excessive noise in the substrate.

In general, the threshold voltage $V_t$ is the minimum voltage necessary to turn on a transistor. One way of adjusting this voltage is by biasing the bulk terminal of the transistor. The monitor 12 spatially senses the threshold voltages $V_{t1}$ to $V_{tn}$ in various regions of the circuit unit 2 and compares the average value of the threshold voltages against the threshold voltage $V_{trf}$ of a reference "quiet" transistor and creates a threshold voltage difference $\Delta V_t$. The comparator-amplifier 18 works as a transducer in the sense that it converts the threshold voltage difference $\Delta V_t$ to a proportional biasing voltage $V_B$ on line 20 necessary to bias the bulk. This biasing voltage $V_B$ is fed back negatively into the circuit unit 2 to reduce in turn the threshold voltage difference $\Delta V_t$. The net result of this closed loop scheme is that the threshold voltage difference $\Delta V_t$ is reduced to a very small value thanks to the high gain of the amplifier 18.

In the following, the control loop of the present invention is described in more detail. The control loop has been adopted for using an amplifier to fix the bulk voltage. The monitor 12 has parallel connected transistors in each branch of the current mirror, which is described in detail in FIGS. 6 and 7. Thus, one set of inputs to the monitor 12 are the threshold voltages $V_{ti}$ of the sensing transistors placed in the circuit unit 2 and the other input is the threshold reference voltage $V_{trf}$ created in the circuit unit 2 as a result of using an internal reference voltage $V_R$. The negative input of the amplifier 18 is connected to the output of the monitor 12, while the positive input is the same reference voltage $V_R$ used for the monitor 12. Using in both circuits 2 and 12 the same voltage reference makes the loop independent of eventual fluctuations of this voltage reference. Furthermore this scheme doesn't need an external threshold voltage reference, because it is internally provided, this way saving a pin. The loop operation is based on the concepts of virtual ground and negative feed-back. The output of the comparator amplifier is $$V_B = A(V_R + \Delta V_T - V_R) \tag{1}$$

where A is the gain of the amplifier 18. If a high-gain amplifier is used $$A \to \infty \Rightarrow \frac{V_B}{A} = 0 \Rightarrow \Delta V_T = 0 \tag{2}$$

Of course this works only if the loop is stable and a negative feedback is present.

Figure 2:
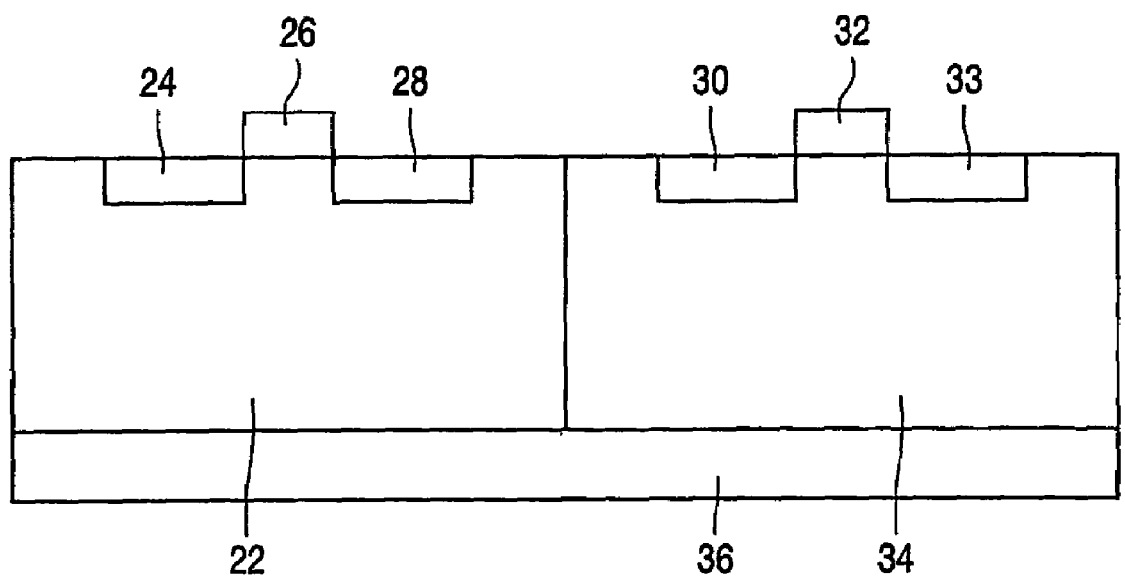
FIG. 2 shows the cross-sectional view of a twin tub technology of a PMOS transistor and a NMOS transistor.

FIG. 2 shows a cross-sectional view of a twin-tub technology. FIG. 2 shows that a PMOS transistor comprising a N well 22, a source 24, a gate 26, and a drain 28. On the right side of the PMOS is a NMOS transistor shown, which comprises a P well 34, a source 30, a gate 32, and a drain 33. The PMOS transistor and the NMOS transistor are mounted on a common P substrate. For the independent biasing of the transistors in the present invention a twin-tub technology is used but the same principle can be used in any other technology differentiating a P from an N well as in the case of triple well technologies. The N well 22 of PMOS transistors is normally connected to the power supply $V_{dd}$. What is suggested here is to connect the N well 22 to a potential different from the power supply. The same is done for the P well 34 of NMOS transistors. The P well 34 is connected to a potential different from ground. The bulk terminal, connected to the N well 22 of PMOS transistors or the P well 34 of NMOS transistors, enables to control the threshold voltage of a MOS transistor. Suppose that all NMOS transistors are the ones under control. Then, the biasing takes place in the P-well. This implies that the reference transistor lies in its own well separated from the rest of the circuit in order to be independent of the biasing of the transistors of circuit unit 2.

It is emphasized that a twin tub technology is shown by way of non-limiting example only. It will be understood by those skilled in the art that the use of other technologies, e.g., triple well technologies, are equally valid without departing from the scope of the present invention.

Figure 3:
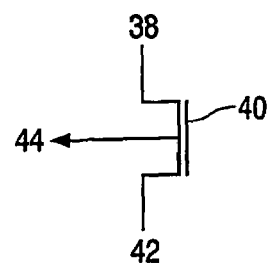
FIG. 3 shows the symbol of a PMOS transistor.
Figure 4:
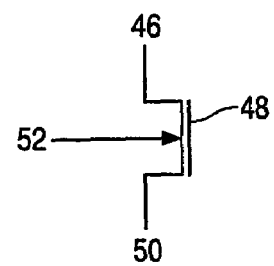
FIG. 4 shows the symbol of a NMOS transistor.

FIG. 3 shows a circuit symbol of a PMOS transistor. The PMOS transistor comprises a drain terminal 38, a gate terminal 40, a source terminal 42, and a bulk terminal 44. FIG. 4 shows a circuit symbol of a NMOS transistor. The NMOS transistor comprises a drain terminal 46, a gate terminal 48, a source terminal 50 and a bulk terminal 52. The bulk terminals 44 and 52 respectively surf to implement the concept of the invention to be explained further below.

Figure 5:
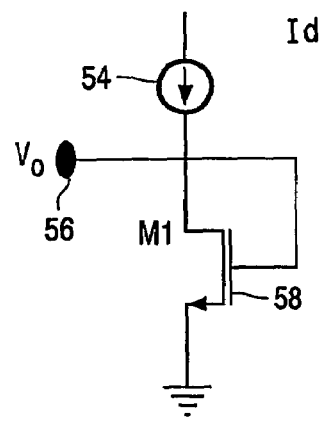
FIG. 5 shows the structure of a circuit extracting the threshold voltage.

FIG. 5 shows a typical circuit extracting the threshold voltage. The circuit comprises a current source 54 connected to the drain of the field effect transistor 58. The terminal 56 is connected to the gate terminal of the transistor 58. The source terminal of the transistor 58 is connected to ground. The simplest way to realize a threshold voltage extractor is to bias in sub-threshold a diode-connected transistor. The drain current $I_D$ is approximated by the following equation (3).

$$I_D \approx I_0 e^{\left[\frac{(V_{GS}-V_t)}{nU_T}\right]} \quad (3)$$

The meaning of each variable is:
$I_D$: real drain current;
$I_0$: theoretical drain current;
$V_{GS}$: voltage between the gate terminal and the source terminal;
$V_t$: threshold voltage;
n: constant value;
$U_T$: thermal voltage.

Neglecting the length modulation channel leads to a good approximation (3) of the drain current of a transistor working in sub-threshold.

Solving the (3) in respect of the threshold voltage, one obtains $$v_o = V_t + nU_T \ln\frac{I_D}{I_0} \quad (4)$$

where n=1.5 typically and $V_0=V_{GS}$. In order to have the best accuracy the drain current $I_D$ has to be chosen $I_D=I_0$, this value depends on the process and transistor geometries.

Figure 6:
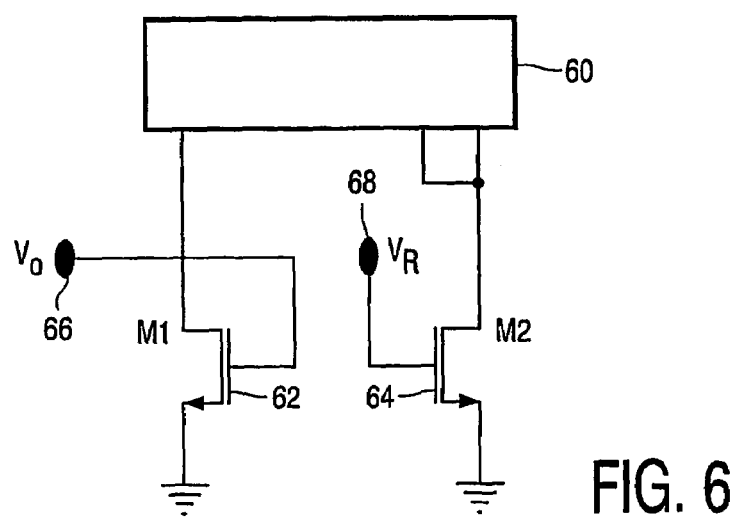
FIGS. 6, 7 show the principle circuit of the present invention.

FIG. 6 shows a possible implementation of the monitor 12. A current mirror 60 is connected to the drain terminal of the transistor 62. The gate terminal of the transistor 62 is connected to the terminal 66. The source terminal of the transistor 62 is connected to ground. The current mirror 66 is also connected to the drain terminal of the transistor 64. The gate terminal of the transistor 64 is connected to the terminal 68. The source terminal of the transistor 64 is connected to ground. The transistor 62 M1 represents the circuit unit 2. The transistor 64 M2 represents the reference circuit. The voltage between the gate terminal and the source terminal of the transistor 62 is measured at terminal 66. The voltage between the gate terminal and the source terminal of the transistor 64 is measured at terminal 68. Terminal 68 represents the reference voltage $V_R$. Terminal 66 represents the measured threshold voltage $V_0$. The monitor 12 of the present invention is completely different from the ones reported in the literature. Basically, this monitor does not extract the absolute threshold voltage as the others do, but it does extract the threshold voltage difference between any at least two transistors. The monitor 12 is simple and accurate. The best accuracy is obtained when the transistors are biased in the subthreshold regions. The advantages of the sensing at multiple points of the monitor 12 are that the sub-threshold operation is done with a better accuracy and a decreased power consumption and that it is possible to implement it, with a very simple circuitry.

The operation of the monitor is as follows. Let M2 be the reference "quiet" transistor and M1 the sense transistor placed somewhere in the circuit. Let M1 be biased in the subthreshold region. Suppose that $V_{t2}$ is different from $V_{t1}$ and that the drain currents are almost the same. It can be shown that $$V_0 \cong V_R + V_{t2} - V_{t1} + nU\ln\frac{\beta_1}{\beta_2} \quad (5)$$
$$\cong V_R + \Delta V_t + \varepsilon$$

where $V_{t1}$ and $V_{t2}$ are the threshold voltages of M1 and M2, respectively. The product nU is approximately 25 mV and $\beta_1$ and $\beta_2$ include the transconductances of M1 and M2 and any possible error due to the current mirror. For almost identical transistors and an almost perfect current mirror, $\epsilon$ is approximately zero because of the logarithm effect.

An alternative description of the operation is that if the reference voltage has been chosen to bias the transistors in sub-threshold, assuming that $I_{M1} \cong I_{M2}$ the deduced equation is (6)

$$\beta_1 e^{\frac{V_{GS1}-V_{T1}}{nU_T}} \approx \beta_2 e^{\frac{V_{GS2}-V_{T2}}{nU_T}} \quad (6)$$

where with $\beta_1$ and $\beta_2$ terms, it has been supposed some mismatching between the two under test transistors or some error due to the mirror. Solving (6) it is possible to get an expression of $\Delta Vt = Vt1 - Vt2$ by equation (7), assuming $V_{GS1} = V_O$ and $V_{GS2} = V_R$ $$V_O = V_R + V_{t1} - V_{t2} + nU_T \ln\frac{\beta_2}{\beta_1}.$$

The eventual presence of an error is minimized by the presence of the logarithmic expression. Furthermore, it is possible to improve this sensing using a bigger number of transistors, getting, instead of the difference between two absolute values of $V_t$, the difference between the threshold voltage of one transistor used as reference and the mean threshold value measured using n transistors.

Figure 7:
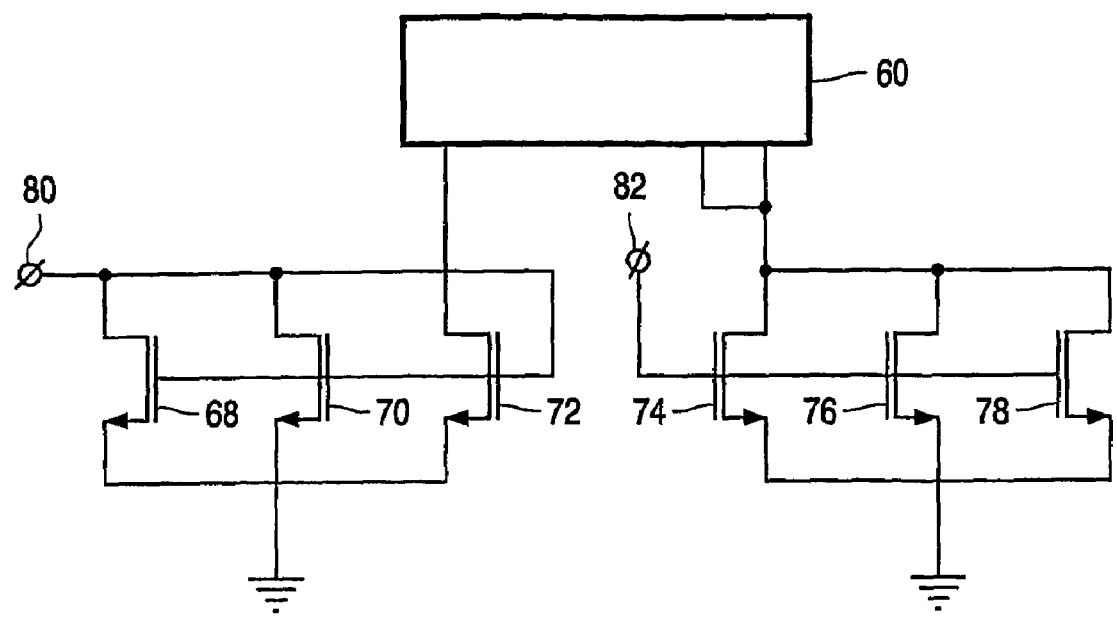

FIG. 7 shows in principle an extension of the FIG. 6. In each branch of the current mirror 60 is the same number of transistors connected in parallel between the current mirror 60 and ground. The branch of the so-called circuit unit comprises three transistors 68, 70, and 72. The drain contacts are connected in parallel, the gate contacts are connected in parallel and the source contacts are connected in parallel. The source contacts are connected to ground. The drain contacts are connected in parallel to the current mirror 60. The gate contacts are connected to the terminal 80. In principle the same is done with the right branch of the current mirror 60. The right branch comprises three transistors 74, 76, 78. The source contacts are connected in parallel to ground. The gate contacts are connected in parallel to the terminal 82. The drain contacts are connected in parallel to the current mirror 60. The same number of transistors has to be used in both branches of the circuit or an equivalently wide transistor in one of the branches in order to have $I_1 \sim I_2$ getting almost the same expression of (6)

$$n\beta_1 e^{\frac{V_{GS1} - V_{T1}}{nU_T}} \approx n\beta_2 e^{\frac{V_{GS2} - V_{Tav}}{nU_T}} \tag{8}$$

Figure 8:
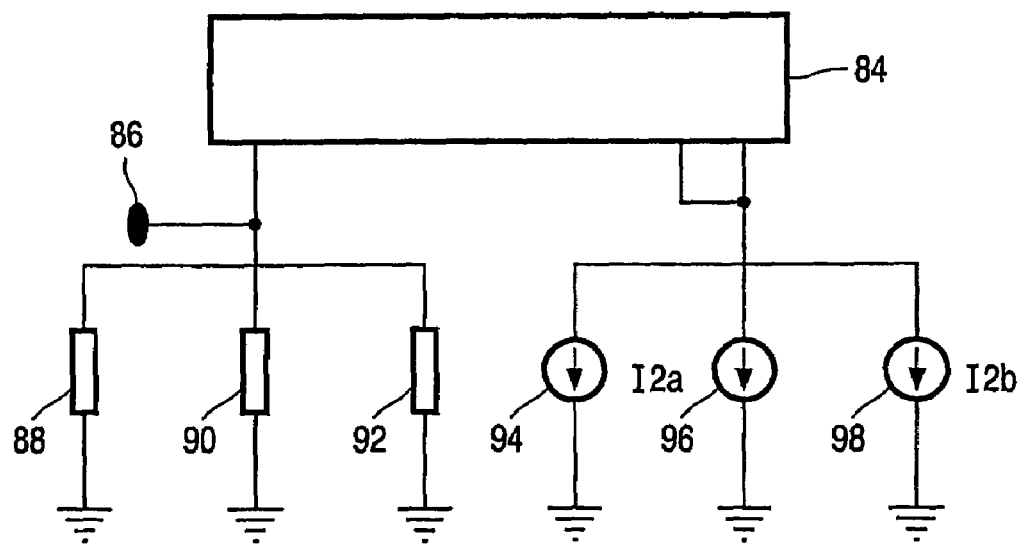
FIG. 8 shows an analogue structure to the structure of FIGS. 6 and 7.

FIG. 8 shows a simple analogy to explain the monitor working. Assume that all the transistors connected to the voltage reference are ideal current sources 94, 96, and 98, connected in parallel between the current mirror 84 and ground, and that the transistors diode connected are approximated with resistances 88, 90, and 92, connected in parallel between the current mirror 84 and ground. The output voltage at terminal 86, connected between the current mirror 84 and the parallel circuit of the resistances 88, 90, and 92, is related to the current in the parallel circuit of the resistances 88, 90, and 92 by the equation $V_o \approx R_{total} I_{total}$, whereby $R_{total}$ represents the total resistance value of the parallel circuit of the resistances 88, 90, 92, i.e.

$$\frac{1}{R_{total}} = \frac{1}{R_1} + \frac{1}{R_2} + \ldots + \frac{1}{R_n},$$

and $I_{total}$ represents the total current in the parallel circuit of the resistances 88, 90, 92, i.e. $I_{total} = I_1 + I_2 + \ldots + I_n$, whereby $R_i = R$ for i from 1 to n. If all the currents are equal then $V_o \approx RI$, if in one of the current source there is a fluctuation in the current the output voltage $V_0$ at terminal 86 is given by the average current $$V_O = \frac{R}{n}(I_1 + I_2 + I_3^* + \ldots + I_n).$$

Figure 9:
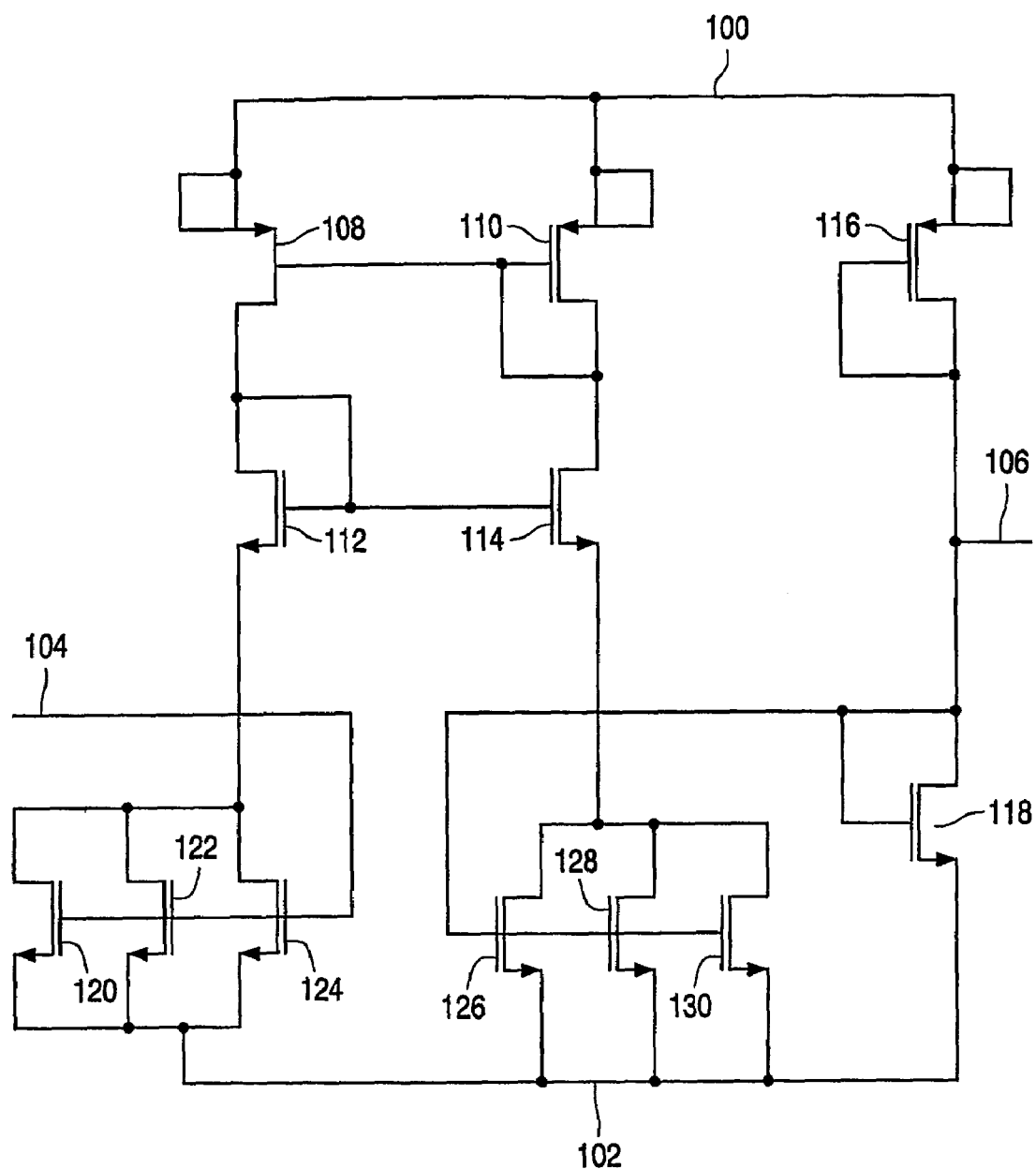
FIG. 9 shows a circuit diagram of an embodiment of the present invention.

FIG. 9 shows a circuit diagram of the present invention. The circuit is connected to power supply at the terminal 100. At the terminal 102, the circuit is connected to ground. The circuit comprises four different groups. The first group is the current mirror comprising the transistors 108, 110, 112, 114. The second group is the reference circuit comprising the transistors 120, 122, 124. The third group is the circuit unit comprising the transistors 126, 128, 130. The fourth group is a voltage divider comprising the transistors 116 and 118. The reference voltage is output at the terminal 104. The threshold voltage of the circuit unit is output at the terminal 106. The transistors 108 and 110 comprise a feedback loop at their source terminal. Furthermore, the source terminal of transistor 108 and transistor 110 are connected to the terminal 100. The gate contacts of the transistors 108 and 110 are connected together. The drain contacts of the transistors 108 and 112 are connected together. The drain contacts of the transistors 110 and 114 are also connected together. Furthermore, the gate contact of the transistor 110 is connected to the drain of the transistor 114. The gate contact of the transistor 112 is connected to the drain contact of transistor 112. The gate contacts of the transistors 112 and 114 are connected together. The source contact of the transistor 112 is connected to the reference circuit. The source contact of transistor 112 is connected in parallel to the drain contacts of the transistors 120, 122, and 124. The gate contact of the transistors 120, 122, 124 are connected together in parallel to the terminal 104. The source contact of the transistors 120, 122, 124 are connected in parallel together to the terminal 102. The source contact of transistor 114 is connected in parallel to the drain contacts of the transistors 126, 128, and 130 of the circuit unit. The gate contacts of the transistors 126, 128, and 130 are connected in parallel together to the terminal 106. The source contact of the transistors 126, 128, and 130 are connected in parallel to the terminal 102. The source terminal of transistor 116 has a feedback loop. The source terminal of transistor 116 is connected to terminal 100. The gate terminal of transistor 116 is connected to the drain contact of the same transistor and to the terminal 106. The drain contact of transistor 116 is connected to the drain contact of transistor 118. The gate contact of transistor 118 is connected to terminal 106. The source contact of transistor 118 is connected to terminal 102. To minimize the error due to the channel length modulation a double feedback mirror has been used, however it cannot be used if the monitor is biased in saturation region, unless doing very big transistors.

Figure 10:
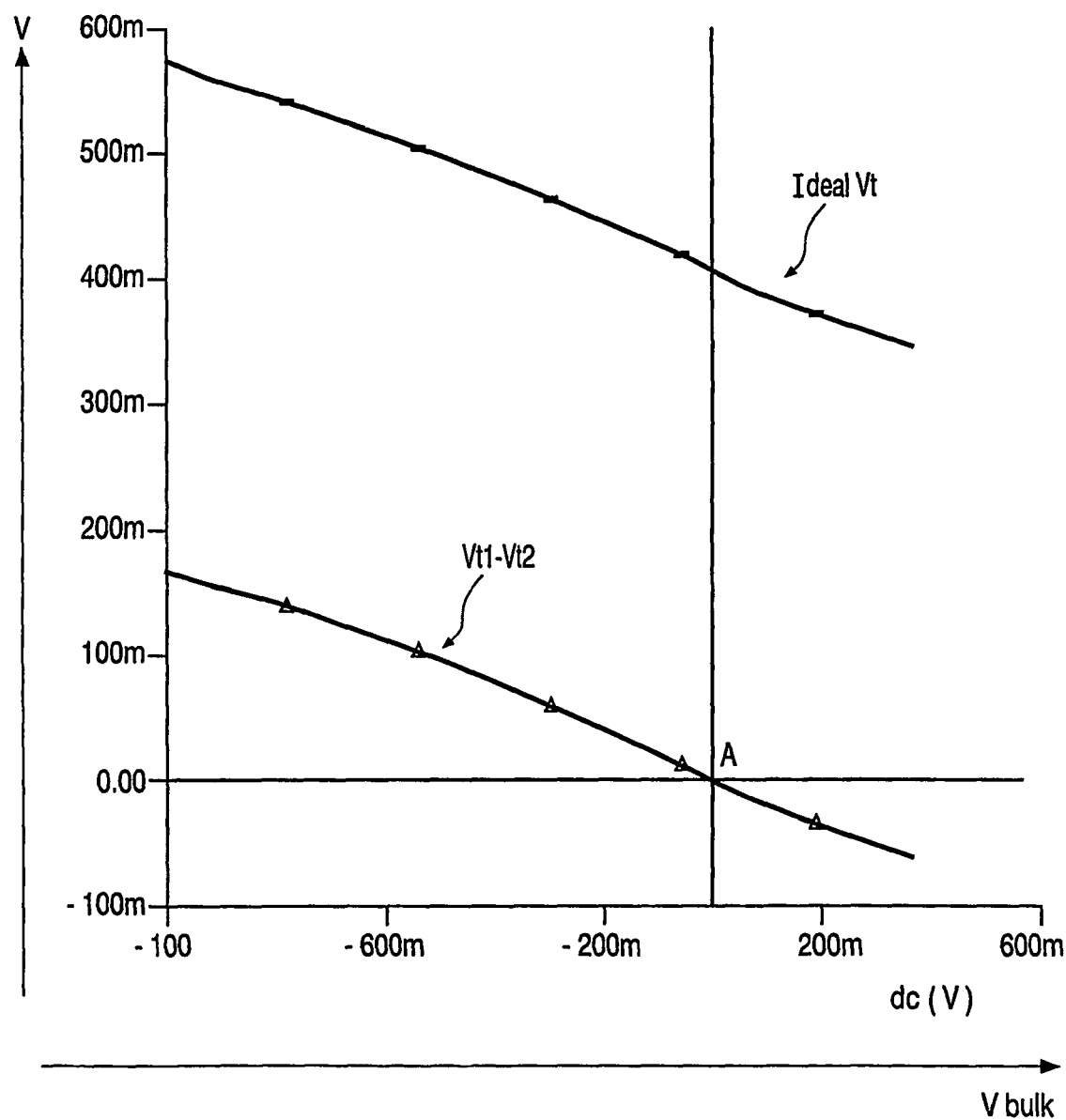
FIG. 10 shows two graphs representing the relation between the threshold voltage and the bulk voltage of two different cases.

FIG. 10 shows a diagram representing the relation between the threshold voltage and the differential voltage. The sizing of the mirror 60 is the most important step in the design of the monitor 12 because a wrong sizing leads to a lack of accuracy. It is well sized when the output of the monitor 12 is equal to the voltage reference if the threshold voltage difference $\Delta V_t$ is zero. The DC simulation result shown in FIG. 10 illustrates the behavior of the monitor 12. The ideal $V_t$ line indicates that the threshold voltage increases by applying a negative voltage to the transistor's bulk. Setting the reference voltage $V_R$ of the monitor 12 equal to zero, applying a voltage to the bulk of M1 (circuit unit), and ground connecting the bulk of M2 (reference transistor), we obtain at the output $V_o$ the threshold voltage difference $\Delta V_t$ between the reference transistor and the one whose $V_t$ is changed by varying the bulk. Notice that in the range of interest the threshold voltage variation for this particular technology in this particular example, has almost linear behavior, and is comparable with a ramp having a slope with value −0.2. It will be understood by those skilled in the art that this slope may substantially vary, because the threshold voltage variations depend on a range of parameters, e.g., implementation dosages and diffusion spreads introduced by the fabrication process.

Figure 11:
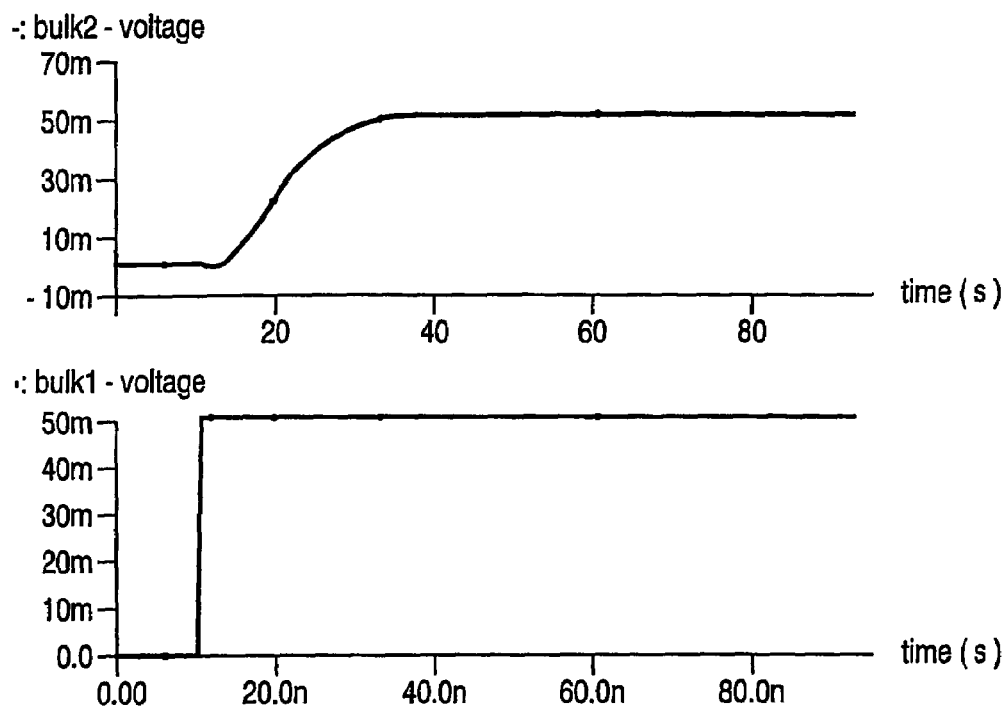
FIG. 11 shows that the bulk of the circuit unit follows changes in the bulk of the reference circuit.

FIG. 11 shows the direct change of the threshold voltage of the circuit unit. Another application is to directly change the threshold voltage of the circuit unit. Because of the feedback control if one changes the bulk of the reference transistor the bulk of the circuit unit will change accordingly. Now assume that there is one reference transistor placed in a well independent of the circuit's well and that there are many sensing transistors placed in the circuit unit and that the control is applied to the shared bulk of the various transistors of the circuit unit. Then by changing the bulk of the reference transistor and sensing the circuit unit the control will automatically change the threshold voltage $V_t$ of all transistors that share the same bulk. The upper diagram of FIG. 11 shows how the control automatically changes the bulk voltage of the transistors of the circuit unit. The lower diagram of FIG. 11 shows the course of the automatic change of the threshold voltage of all transistors in the circuit unit. In the lower diagram of FIG. 11 the voltage jumps from 0 V to 50 mV.

Figure 12:
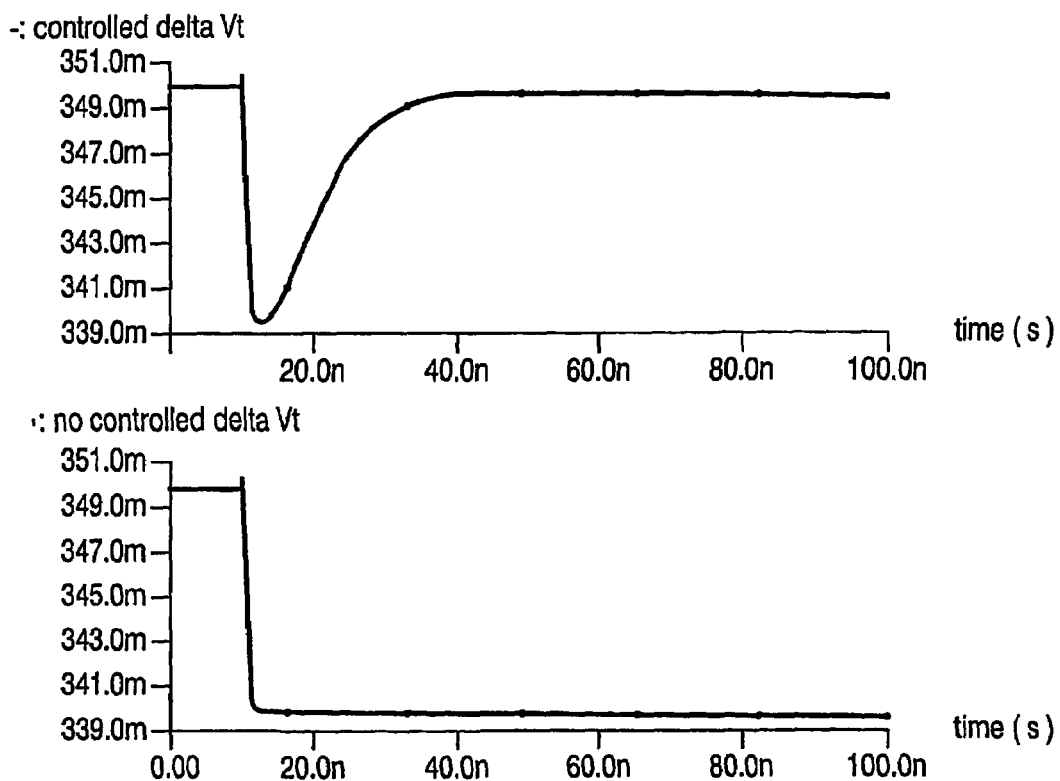
FIG. 12 shows how the control loop restores the threshold voltage after a change in the bulk.

FIG. 12 shows the effect of the control on the threshold voltage when a step is applied to the bulk of the reference transistor. In this case a step of 50 mV is applied to the bulk of the reference transistor. In this case the monitors $V_R$ is 350 mV. Observe that the threshold voltage $V_t$ decreases by 10 mV as a consequence of the 50 mV step in the bulk of the reference transistor and that the control loop restores the threshold voltage $V_t$ again so that the difference threshold voltage $\Delta V_t$ is zero. In the upper diagram of FIG. 12 the case of the controlled difference threshold voltage $\Delta V_t$ is shown and in the lower diagram of FIG. 12 the case of the not controlled difference threshold voltage $\Delta V_t$ is shown.

Figure 13:
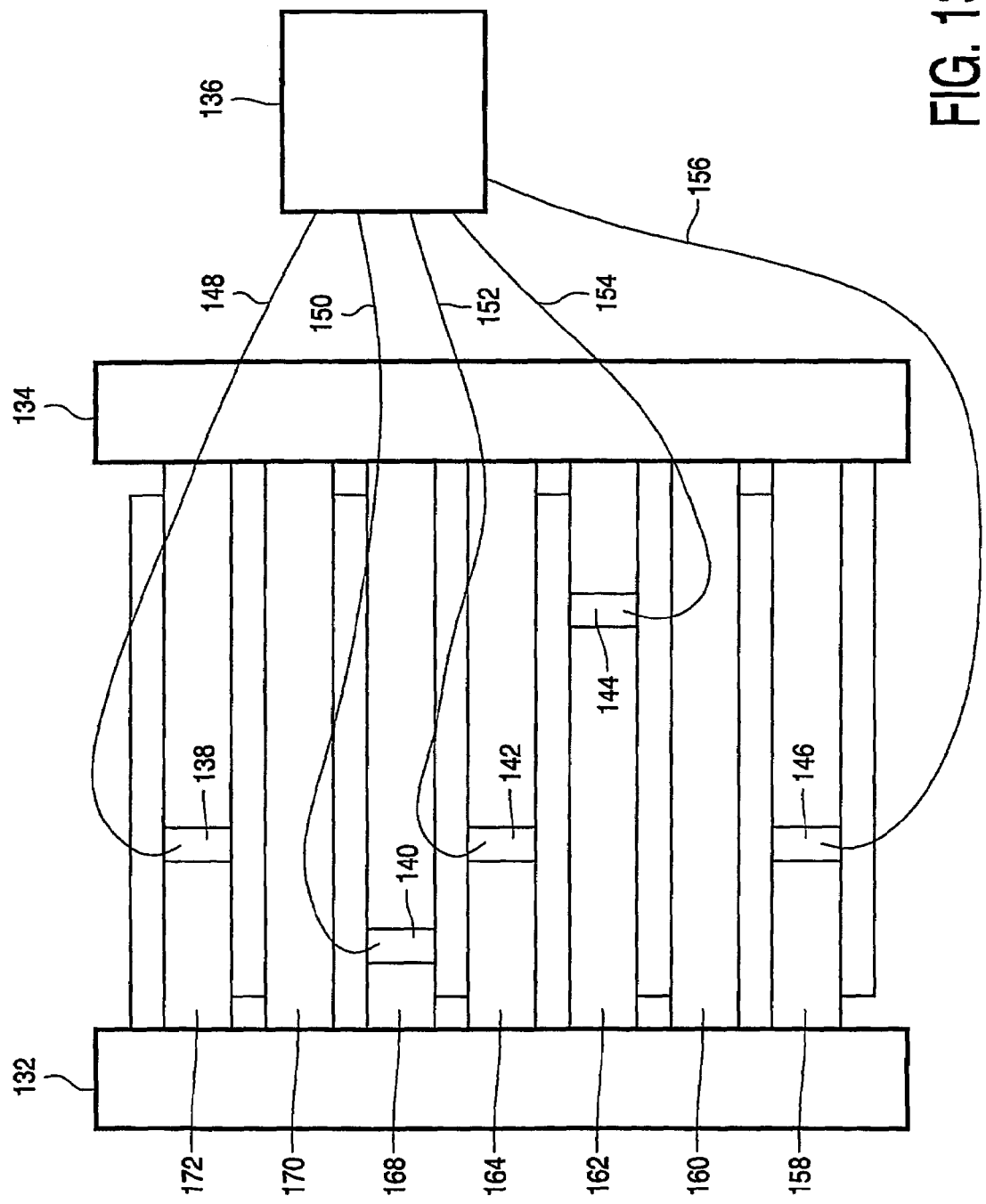
FIG. 13 shows a layout of a threshold voltage sensing scheme.

FIG. 13 shows a layout of a threshold voltage $V_t$ sensing scheme. This sensing scheme comprises a power supply line 132, a ground line 134, a threshold voltage control scheme 136, threshold voltage sensing transistors 138, 140, 142, 144, 146, connecting lines 148, 150, 152, 154, 156 connecting the sensing transistors 138, 140, 142, 144, 146 to the control scheme 136, and rows of standard cells 158, 160, 162, 164, 168, 170, 172. FIG. 13 shows a sensing scheme in a standard cell layout style; since the sense transistors are small they can be placed almost anywhere in the layout.

Figure 14:
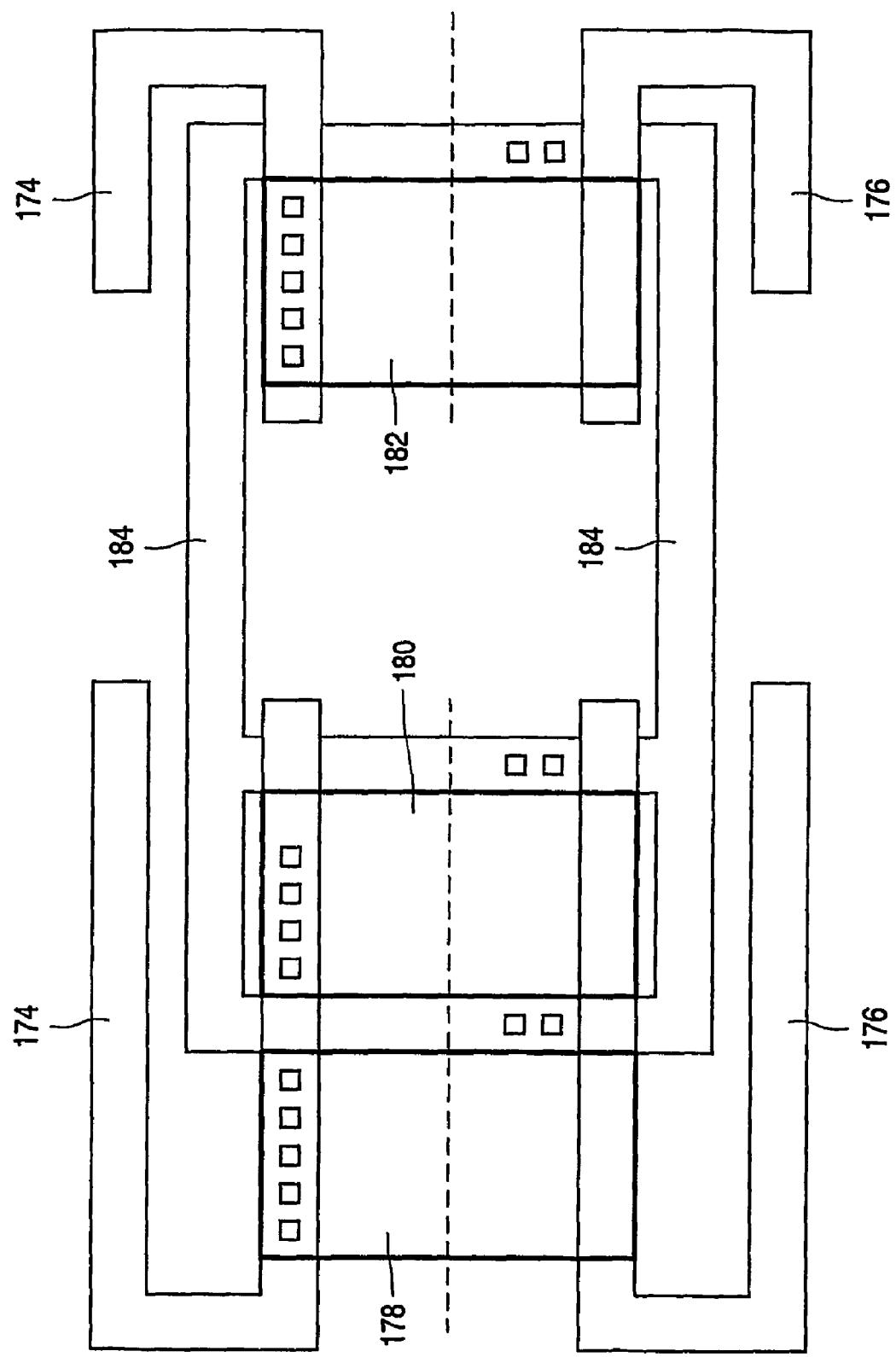
FIG. 14 shows a layout for power supply and bulk line routing.

FIG. 14 shows a layout for power supply and bulk line routing. The layout comprises a power supply line 174, a ground line 176, standard cells 178, 180, 182 and a bulk line 184. The standard cells 178, 180, 182 consist of an arrangement of P-MOSFETs and or N-MOSFETs. One has to exercise care for the layout as biasing the bulk independently from the source can give origin to latch-up problems, or to induced noise in the bulk line. We propose a closed-loop scheme for power supply and bulk biasing. FIG. 14 shows details for routing the power supply and bulk line for the particular case of NMOS $V_t$ control. Note that there is a choice in making contacts to the well. This can be done for every cell or every N cells.

New characteristics and advantages of the present invention covered by this document have been set forth in the foregoing description. It will be understood, however, that this disclosure is, in many respects, only illustrative. Changes may be made in details, particularly in matters of shape, size, and arrangement of parts, without exceeding the scope of the present invention. The scope of the present invention is, of course, defined in the language in which the appended claims are expressed.

The invention claimed is:

1. A control unit controlling a threshold voltage of a circuit unit having a plurality of transistor devices, comprising:
    a reference circuit;
    a measuring unit measuring a threshold voltage of at least one sensing transistor of the circuit unit and measuring a reference threshold voltage of at least one reference transistor of the reference circuit;
    a differential voltage generator generating a differential voltage from outputs of the measuring unit, the voltage generator comprising an averaging unit, a comparing unit and an amplifier; and a bulk connection of the transistor devices in the circuit unit to which the differential voltage is fed as a biasing voltage;
    wherein the averaging unit forms at least one average threshold voltage value of at least one measured transistor threshold voltage of the circuit unit;
    the comparing unit compares at least one average threshold voltage value of the circuit unit with at least one measured transistor threshold voltage of the reference circuit and creating at least one difference voltage value indicating the difference between at least one average threshold voltage value of the circuit unit and at least one transistor threshold voltage of the reference circuit; and
    the amplifier unit amplifies at least one difference voltage value of the comparing unit and creating at least one amplified difference voltage value.

2. The control unit of claim 1, wherein the amplifier unit is a high gain amplifier.

3. The control unit of claim 1, wherein the reference circuit comprises at least one reference transistor in at least one comparator amplifier.

4. The control unit of claim 3, wherein the reference transistor is provided in a separate well of the chip comprising the circuit unit.

5. The control unit of claim 3, wherein the reference transistor is controlled separately from the transistor devices of the circuit unit by a reference voltage.

6. The control unit of claim 1, wherein the measuring unit comprises at least one sensing transistor sensing the threshold voltage.

7. The control unit of claim 1, wherein the sensing transistor is controlled separately from the reference transistor by a sensing voltage.

8. The control unit of claim 1, wherein the circuit unit comprises a plurality of transistor devices, and wherein a first sub-plurality of the transistor devices is employed as reference transistors and a second sub-plurality of the transistor devices is employed as sensing transistors, and wherein the differential output of the differential voltage generator is fed as a biasing voltage to the bulk of the plurality of transistor devices.

9. An integrated circuit (IC) device comprising a circuit unit and a control unit according to claim 1.

10. A method for controlling of at least one threshold voltage of transistors in a circuit unit comprising:
    measuring at least one transistor threshold voltage of the circuit unit;

providing at least one reference transistor and measuring a threshold voltage of the at least one reference transistor;
generating a differential voltage from outputs of the measuring unit comprising the acts of:
forming at least one average threshold voltage value of at least one measured transistor threshold voltage of the circuit unit;
comparing at least one average threshold voltage value of the circuit unit with at least one measured transistor threshold voltage of the reference circuit and creating at least one difference voltage representing the difference between at least one average threshold voltage value of the circuit unit and at least one transistor threshold voltage of at least one reference transistor; and
amplifying the at least one difference voltage of the comparing unit and creating at least one amplified difference voltage; and
feeding the differential voltage as a biasing voltage to a bulk connection of the transistor devices in the circuit unit.

11. The method of claim 10, wherein a plurality of transistor devices is divided up into a first sub-plurality of reference transistors and a second sub-plurality of sensing transistors and wherein
the transistor threshold voltage of the first sub-plurality is measured as reference voltage;
the threshold voltage of the second sub-plurality is measured as sensing voltage;
a differential voltage is generated from the reference voltage and the sensing voltage and wherein
the differential voltage is input to the bulk of the plurality of transistor devices.

12. The method of claim 10, wherein the controlling of at least one threshold voltage of transistors in a circuit unit is done in a closed loop.

13. The method of claim 12, wherein the controlling in the closed loop includes a controlling of a power supply.

14. The method of claim 10, wherein the amplified average voltage is negatively fed back to the circuit unit for reducing the threshold voltage difference between the circuit unit and the reference circuit.

15. The method of claim 10, wherein the threshold voltage is directly measured.

16. A controller for controlling of at least one threshold voltage of transistors in a circuit unit comprising:
means for measuring at least one transistor threshold voltage of the circuit unit;
means for providing at least one reference transistor and measuring a threshold voltage of the at least one reference transistor;
means for generating a differential voltage from outputs of the measuring unit; wherein the means for generating include:
means for forming at least one average threshold voltage value of at least one measured transistor threshold voltage of the circuit unit;
means for comparing at least one average threshold voltage value of the circuit unit with at least one measured transistor threshold voltage of the reference circuit and creating at least one difference voltage representing the difference between at least one average threshold voltage value of the circuit unit and at least one transistor threshold voltage of at least one reference transistor; and
means for amplifying the at least one difference voltage of the comparing unit and creating at least one amplified difference voltage; and
feeding the differential voltage as a biasing voltage to a bulk connection of the transistor devices in the circuit unit.

17. A controller comprising:
a circuit unit including a plurality of transistors;
a reference circuit including a reference transistor having a reference voltage at a terminal;
a sensor circuit including sensors located at various regions of the circuit unit and configured to sense threshold voltages of the plurality of transistors; the sensor circuit being configured to average the threshold voltages to form an averaged threshold voltage, and to compare the averaged threshold voltage with the reference voltage to form a threshold voltage difference; and
a comparator configured to compare the averaged threshold voltage difference with the reference voltage;
wherein an output of the comparator is connected to a bulk connection of the circuit unit to form a control loop that changes at least one of the threshold voltages so that the averaged threshold voltage difference is zero.

18. The controller of claim 17, wherein the terminal is a gate of the reference transistor.

19. The controller of claim 17, wherein the reference circuit and the sensor circuit include a same number of transistors.

20. A controller comprising:
a circuit unit including a plurality of transistors, a reference transistor, and a bulk connection, wherein a terminal of the reference transistor has a reference voltage;
a sensor circuit including a sensor configured to sense threshold voltages of the plurality of transistors to form an averaged threshold voltage, and to compare the averaged threshold voltage with the reference voltage to form a threshold voltage difference; and
a comparator configured to compare the threshold voltage difference with the reference voltage;
wherein an output of the comparator is connected to the bulk connection to form a control loop that changes at least one of the threshold voltages so that the threshold voltage difference is minimized.

21. The controller of claim 20, wherein the terminal is a gate of the reference transistor.

22. The controller of claim 20, wherein the reference circuit and the sensor circuit include a same number of transistors.

* * * * *